US012642112B2

(12) United States Patent
Han et al.

(10) Patent No.: US 12,642,112 B2
(45) Date of Patent: May 26, 2026

(54) WIRING SUBSTRATE AND ELECTRONIC DEVICE

(71) Applicants: Hefei BOE Ruisheng Technology Co., Ltd., Anhui (CN); BOE Technology Group Co., Ltd., Beijing (CN)

(72) Inventors: Tingwei Han, Beijing (CN); Zouming Xu, Beijing (CN); Jie Wang, Beijing (CN); Xintao Wu, Beijing (CN); Jiawei Xu, Beijing (CN); Ningyu Luo, Beijing (CN)

(73) Assignees: Hefei BOE Ruisheng Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 647 days.

(21) Appl. No.: 18/026,083

(22) PCT Filed: May 20, 2022

(86) PCT No.: PCT/CN2022/094141
§ 371 (c)(1),
(2) Date: Mar. 13, 2023

(87) PCT Pub. No.: WO2023/221096
PCT Pub. Date: Nov. 23, 2023

(65) Prior Publication Data
US 2024/0312917 A1 Sep. 19, 2024

(51) Int. Cl.
*H01L 23/538* (2006.01)
*H10W 70/60* (2026.01)
(Continued)

(52) U.S. Cl.
CPC .......... *H10W 70/65* (2026.01); *H10W 70/611* (2026.01); *H10W 90/00* (2026.01)

(58) Field of Classification Search
CPC . H01L 23/5386; H01L 25/165; H01L 25/167; G02F 1/133; H10H 20/857
See application file for complete search history.

(56) References Cited

U.S. PATENT DOCUMENTS

2011/0043499 A1 2/2011 Cok
2018/0084614 A1 3/2018 Bower et al.
(Continued)

FOREIGN PATENT DOCUMENTS

CN 109031779 A 12/2018
CN 110649042 A 1/2020
(Continued)

OTHER PUBLICATIONS

U.S. Appl. No. 18/688,897 notice of allowance dated Mar. 2, 2026.
CN202280001308.0 second office action dated Mar. 3, 2026.

*Primary Examiner* — Marlon T Fletcher
*Assistant Examiner* — Christina A Sylvia
(74) *Attorney, Agent, or Firm* — IPro, PLLC

(57) ABSTRACT

Provided are a wiring substrate and an electronic device, the wiring substrate includes a substrate; first pad group, arranged on the substrate, each of the first pad group including an output pad; a constant voltage signal line, arranged on a same side of the substrate as the first pad group; and second pad groups, including a plurality of sub-pad groups connected in parallel, each of the sub-pad groups including a plurality of pad regions connected in series.

20 Claims, 9 Drawing Sheets

(51) Int. Cl.
    *H10W 70/65*     (2026.01)
    *H10W 90/00*     (2026.01)

(56)         References Cited

U.S. PATENT DOCUMENTS

| 2018/0233094 | A1 | 8/2018 | Kumamoto et al. |
|---|---|---|---|
| 2021/0143134 | A1 | 5/2021 | Wang |
| 2022/0005989 | A1 | 1/2022 | Ban et al. |
| 2022/0101801 | A1* | 3/2022 | Zhang .................... G09G 3/342 |
| 2022/0319452 | A1* | 10/2022 | Yang .................... G09G 3/2085 |
| 2022/0350199 | A1 | 11/2022 | Sang et al. |
| 2024/0282737 | A1 | 8/2024 | Sun et al. |

FOREIGN PATENT DOCUMENTS

| CN | 113130463 | A | 7/2021 |
|---|---|---|---|
| CN | 113168046 | A | 7/2021 |
| CN | 113498490 | A | 10/2021 |
| CN | 113964112 | A | 1/2022 |
| CN | 114171661 | A | 3/2022 |
| CN | 114280841 | A | 4/2022 |
| CN | 114442353 | A | 5/2022 |
| CN | 114823762 | A | 7/2022 |
| CN | 115084345 | A | 9/2022 |
| CN | 115472732 | A | 12/2022 |
| CN | 116489874 | A | 7/2023 |
| WO | 2021062630 | A1 | 4/2021 |
| WO | 2022110238 | A1 | 6/2022 |

* cited by examiner

WIRING SUBSTRATE AND ELECTRONIC DEVICE

CROSS REFERENCE TO RELATED APPLICATIONS

The present disclosure is a National Stage of International Application No. PCT/CN2022/094141, filed May 20, 2022.

FIELD

The present disclosure relates to the field of display technology, and in particular, to a wiring substrate and an electronic device.

BACKGROUND

Micro light-emitting diodes, whose size is less than 500 μm, have the advantages of smaller size, ultra-high brightness and long service life, so their use trend in the display field is obviously increasing.

SUMMARY

The solutions of the wiring substrate and the electronic device provided by the present disclosure are as follows.

In one aspect, an embodiment of the present disclosure provides a wiring substrate, including:

a substrate;

a first pad group, arranged on the substrate, the first pad group includes an output pad;

a constant voltage signal line, arranged on a same side of the substrate as the first pad group; and a second pad group, including a plurality of sub-pad groups connected in parallel, each of the sub-pad groups including a plurality of pad regions connected in series.

In some embodiments, the above wiring substrate provided by an embodiment of the present disclosure further includes a connection line, where the constant voltage signal line is coupled to the plurality of sub-pad groups connected in parallel through the connection line.

In some embodiments, in the above wiring substrate provided by an embodiment of the present disclosure, the wiring substrate includes a plurality of second pad groups;

the plurality of second pad groups are arranged in an array on the substrate;

all of the pad regions in a same second pad group are arranged in an array on the substrate; and at least a portion of the connection line is located between at least two of the pad regions in the second pad group.

In some embodiments, in the above wiring substrate provided by an embodiment of the present disclosure, a line width of the connection line is greater than a line width of the constant voltage signal line.

In some embodiments, in the above wiring substrate provided by an embodiment of the present disclosure, the connection line includes a first line portion with a same extension direction as the constant voltage signal line; and a second line portion with an extension direction crossed with the constant voltage signal line; where the second line portion connects the constant voltage signal line with the first line portion.

In some embodiments, in the above wiring substrate provided by an embodiment of the present disclosure, an orthographic projection of the first pad group on the substrate and an orthographic projection of the connection line on the substrate do not overlap each other.

In some embodiments, in the above wiring substrate provided by an embodiment of the present disclosure, the second pad group includes two sub-pad groups connected in parallel, wherein one sub-pad group includes a first pad region and a second pad region connected in series, and the other sub-pad group includes a third pad region and a fourth pad region connected in series.

In some embodiments, in the above wiring substrate provided by an embodiment of the disclosure, the first pad region is arranged in a same column as the second pad region; the first pad region is arranged in a same row as the third pad region; the fourth pad region is arranged in a same row as the second pad region; and the fourth pad region is arranged in a same column as the third pad region.

In some embodiments, in the above wiring substrate provided by an embodiment of the disclosure, the first pad region is arranged in a same row as the second pad region; the first pad region is arranged in a same column as the third pad region; the fourth pad region is arranged in a same column as the second pad region; and the fourth pad region is arranged in a same row as the third pad region.

In some embodiments, in the above wiring substrate provided by an embodiment of the disclosure, the first pad region is arranged in a same column as the third pad region; the first pad region is arranged in a same row as the fourth pad region; the second pad region is arranged in a same row as the third pad region; and the second pad region is arranged in a same column as the fourth pad region.

In another aspect, an embodiment of the present disclosure provides an electronic device including the above wiring substrate provided by an embodiment of the present disclosure, a driver chip coupled to the first pad group; and electronic components coupled to the second pad group.

In some embodiments, the above electronic device according to an embodiment of the disclosure further includes a plurality of first transparent protection structures, where an orthographic projection of each of the first transparent protection structures on the substrate covers an orthographic projection of each of the electronic components on the substrate.

In some embodiments, in the above electronic device provided by an embodiment of the disclosure, an orthographic projection of the connection line on the substrate and an orthographic projection of each of the first transparent protection structures on the substrate do not overlap each other.

In some embodiments, the above electronic device provided by an embodiment of the present disclosure further includes second transparent protection structures, wherein an orthographic projection of each of the second transparent protection structures on the substrate covers an orthographic projection of a micro-driver chip on the substrate.

In some embodiments, in the above electronic device provided by an embodiment of the present disclosure, an orthographic projection of the connection line on the substrate at most partially overlaps with an orthographic projection of the second transparent protection structures on the substrate.

In some embodiments, in the above electronic device provided by an embodiment of the present disclosure, the connection line is provided with a concave part in an intersection area of the first line portion and the second line portion; an orthographic projection of the first line portion on the substrate do not overlap with an orthographic projection of the second transparent protection structures on the substrate; and an orthographic projection of the second line portion on the substrate do not overlap with an orthographic projection of the second transparent protection structures on the substrate.

DETAILED DESCRIPTION OF THE EMBODIMENTS

Figure 1:
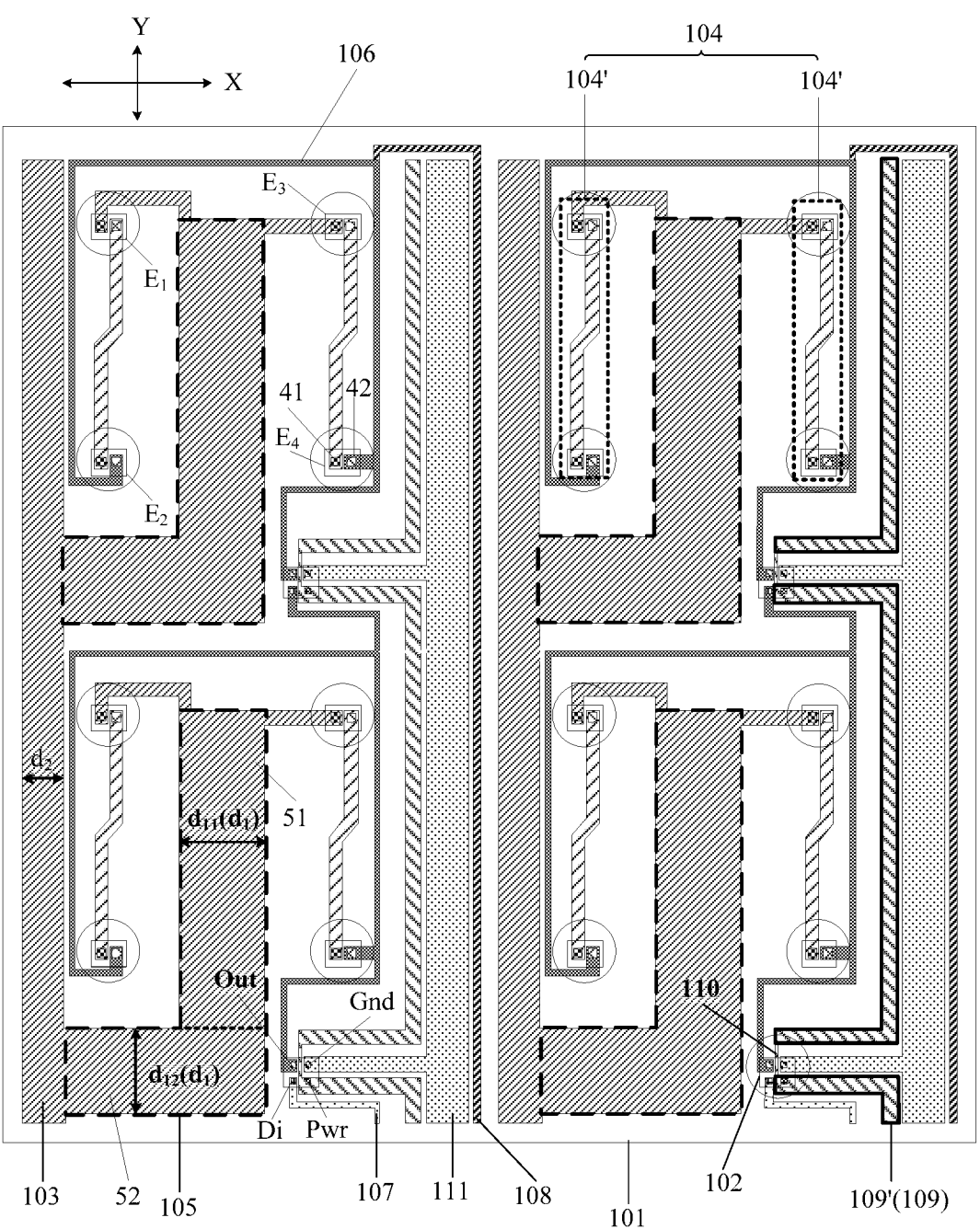
FIG. 1 is a structural schematic diagram of a wiring substrate according to an embodiment of the present disclosure.

In order to make the objectives, solutions and advantages of embodiments of the present disclosure more clear, the solutions of embodiments of the present disclosure will be clearly and completely described below in conjunction with the accompanying drawings of embodiments of the present disclosure. It should be noted that the sizes and shapes of the figures in the drawings do not reflect the true scale, but are merely illustrative of the present disclosure. The same or similar reference signs throughout refer to the same or similar components or components having the same or similar function. To keep the following description of embodiments of the present disclosure clear and concise, the present disclosure omits detailed descriptions of known functions and known components.

Unless otherwise defined, technical or scientific terms used herein shall be in the ordinary sense understood by those of ordinary skill in the art to which this disclosure belongs. The terms "first," "second," and the like, as used herein in the description and in the claims, do not denote any order, quantity, or importance, but are merely used to distinguish one component from another. The word "including" or "containing" and the like means that components or items preceding the word appear to encompass components or items listed after the word and equivalents thereof, without excluding other components or items. "Inner", "outer", "upper", "lower" and the like are only used to indicate relative positional relationships, which may change accordingly when the absolute position of the object being described changes.

Micro light-emitting diode display technology combines many advantages of liquid crystal display technology and organic light-emitting display technology, in particular, when the micro light-emitting diode display technology is applied to backlights, more precise dynamic backlight effect can be achieved. While effectively increasing screen brightness and contrast, it can also address glare between bright and dark areas of the screen caused by conventional dynamic backlights and optimize visual experience, and is more suitable for oversized screen products.

In large electronic devices, a plurality of electronic components and a micro-driver chip form a function area, and hundreds of thousands of function areas are arranged in an array. Without calculating the path loss, to ensure that each electronic component operates properly at the rated power, the plurality of electronic components in each of the function areas are connected in series, and the output power of the micro-driver chip providing drive signals to the plurality of electronic components is at least $I^2 * R_{total}$, wherein I is the rated current of the electronic components and $R_{total}$ is the sum of the resistances of the plurality of electronic components within one of the function areas.

Figure 2:
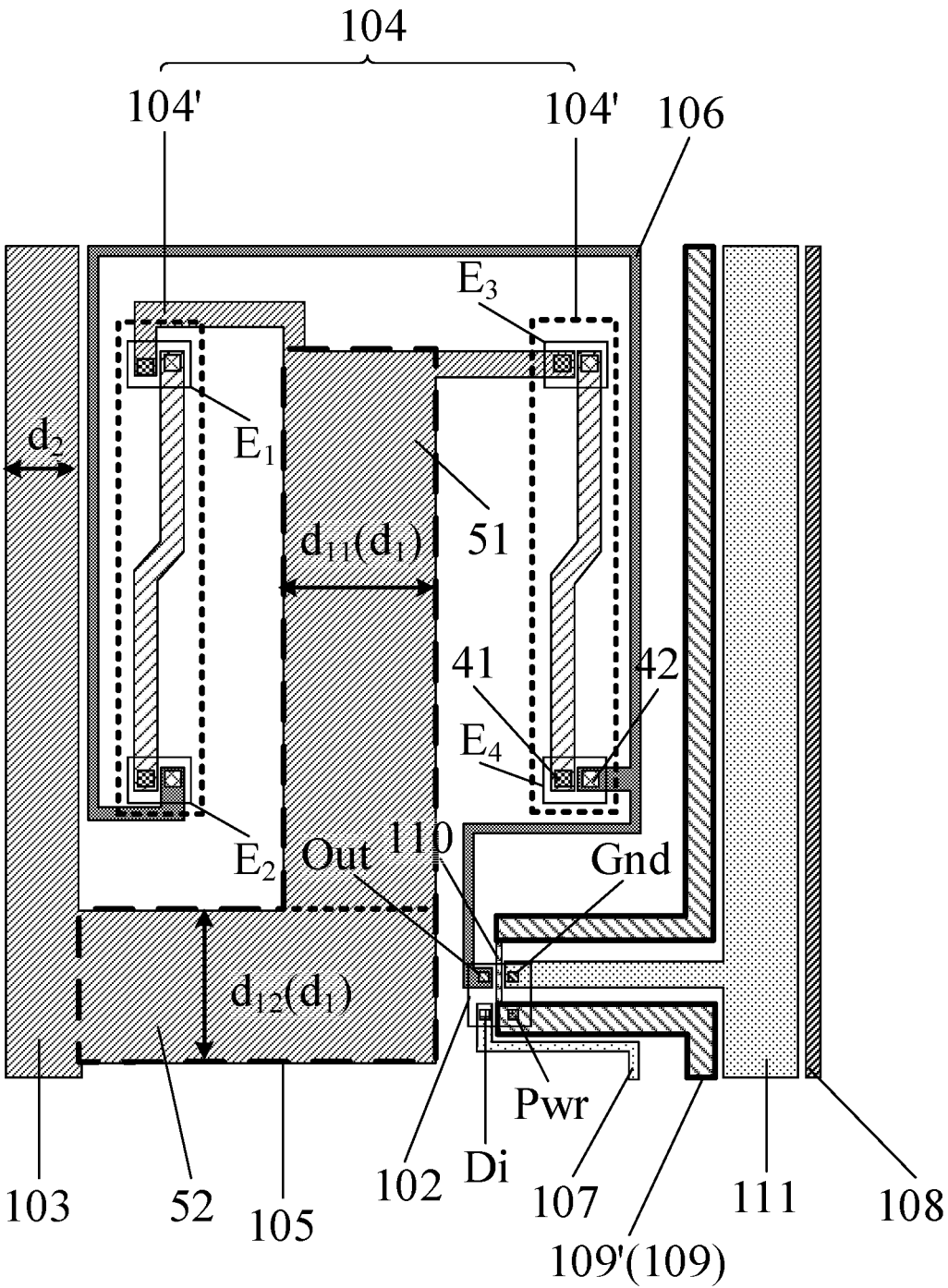
FIG. 2 is a structural schematic diagram of a region of a wiring substrate in which a first pad group and a coupled second pad group are located according to an embodiment of the present disclosure.

Embodiments of the present disclosure provide a wiring substrate, as shown in FIGS. 1 and 2, including:

a substrate 101;

a first pad group 102, arranged on the substrate 101, each of the first pad group 102 including an output pad Out;

a constant voltage signal line 103, arranged on a same side of the substrate 101 as the first pad group 103; and a second pad group 104, including a plurality of sub-pad groups 104' connected in parallel, each of the sub-pad groups 104' including a plurality of pad regions (e.g., E1 and E2, E3 and E4) connected in series.

In some embodiments, each pad region (e.g. $E_1$ to $E_4$) includes at least a first pad 41 and a second pad 42, on the series circuit of each sub-pad group 104', the first pad 41 of the first pad region (e.g., $E_1$ or $E_3$) is coupled with the constant voltage signal line 103, the second pad 42 of the nth pad region (e.g., $E_1$ or $E_3$) is coupled with the first pad 41 of the (n+1)th pad region (e.g., $E_2$ or $E_4$), and the second pad 42 of the last pad region (e.g., $E_2$ or $E_4$) is coupled with the output pad Out of the first pad group 102.

In the above wiring substrate provided by an embodiment of the present disclosure, within one second pad group 104 (corresponding to one light zone), the pad regions (e.g., $E_1$ to $E_4$) are connected in series into a plurality of sub-pad groups 104', and the sub-pad groups 104' are connected in parallel, such that series-parallel connection is made between electronic components coupled to the pad regions (e.g., $E_1$ to $E_4$). Without calculating the path loss, to ensure that each electronic component operates properly at the rated power, the output power of the micro-driver chip coupled to the first pad group 102 is at least $$I^2 / \left[ \sum_{t=1}^{m} (1/R_t) \right],$$

wherein I is the rated current of the electronic component, m is the total number of sub-pad groups 104' included in a second pad group 104, t is an integer greater than or equal to 1 and less than or equal to m, $R_m$ is the sum of the resistances of the electronic components connected in series in a sub-pad group 104', and $$\sum_{t=1}^{m}(1/R_t)$$

is the inverse of the sum of the resistances of the electronic components connected in parallel in a second pad group 104. When the number N of the electronic components coupled to the second pad group 104 is unchanged, and the resistance of each electronic component is R, $$\sum_{t=1}^{m}(1/R_t)$$

is $m^2/(N*R)$, and $R_{total}$ is $N*R$ in the related art, so the output power $$I^2 / \left[ \sum_{t=1}^{m}(1/R_t) \right]$$

of the micro-driver chip in this disclosure is $(N*R*I^2)/m^2$, and the output power $I^2*R_{total}$ of the micro-driver chip in the related art is $N*R*I^2$. In contrast, the output power of the micro-driver chip of the present disclosure is less than the output power of micro-driver chip in the related art. Therefore, the micro-driver chip with smaller power and lower cost can be used in the present disclosure to replace the micro-driver chip with larger power and higher cost in the related art, thus saving costs and improving product competitiveness.

In some embodiments, in the above-described wiring substrate provided by an embodiment of the present disclosure, as shown in FIG. 1 and FIG. 2, the wiring substrate further includes a connection line 105, the constant voltage signal line 103 is coupled to a plurality of sub-pad groups 104' arranged in parallel through the connection line 105. In some embodiments, the constant voltage signal line 103 is connected to the first pad 41 of each first pad region (e.g., $E_1$ and $E_3$) of each sub-pad group 104' via a connection line 105, such that the constant voltage signal provided by the constant voltage signal line 103 passes to the first pad 41 of each first pad region (e.g., $E_1$ and $E_3$) of each sub-pad group 104' via the connection line 105.

In some embodiments, in the above-described wiring substrate provided by an embodiment of the present disclosure, as shown in FIG. 1 and FIG. 2, the number of the second pad groups 104 is plural (only 2*2 are shown) and the second pad groups 104 are arranged in an array on the substrate 101, and all the pad regions (e.g., $E_1$ to $E_4$) in the same second pad group 104 are arranged in an array on the substrate 101; at least a portion of the connection line 105 is located between at least two pad regions (e.g., $E_1$ to $E_4$) in the second pad group 104 to make reasonable use of the space between the pad regions (e.g., $E_1$ to $E_4$) for wiring.

In some embodiments, in the above-described wiring substrate provided by an embodiment of the present disclosure, as shown in FIG. 1 and FIG. 2, in order to reduce the loss of the constant voltage signal provided by the constant voltage signal line 103 on the transmission path, the connection line 105 may be routed with full utilization of the space between the pad regions (e.g., $E_1$ to $E_4$) such that the line width of the connection line 105 is as large as possible, and accordingly the resistance of the connection line 105 is as small as possible. In some embodiments, the line width $d_1$ of the connection line 105 is greater than the line width $d_2$ of the constant voltage signal line. For example, the line width $d_1$ of the connection line 105 is greater than 1000 μm and less than or equal to 3553 μm, the line width $d_2$ of the constant voltage signal line is greater than or equal to 1000 μm and less than or equal to 1433 μm, specifically, the line width $d_1$ of the connection line 105 may be 1991.82 μm, 2000 μm, or the like, the line width $d_2$ of the constant voltage signal line is 1000 μm, or the like.

In some embodiments, in the above-described wiring substrate provided by an embodiment of the disclosure, as shown in FIG. 1 and FIG. 2, the connection line 105 can include a first line portion 51 with a same extension direction as the constant voltage signal line 103, and a second line portion 52 with an extension direction crossed with the constant voltage signal line 103, where the second line portion 52 connects the constant voltage signal line 103 and the first line portion 51. In some embodiments, the first line portion 51 may be routed at a column gap of between the pad regions (e.g., $E_1$ to $E_4$) in the same second pad group 104, with a line width $d_{11}$ of the first line portion 51 being greater than or equal to 2000 μm and less than or equal to 3553 μm, for example, the line width $d_{11}$ of the first line portion 51 is 2000 μm, 2500 μm, 3000 μm, 3500 μm, and so on. The second line portion 52 may be routed at a row gap of the adjacent second pad group 104, the line width $d_{12}$ of the second line portion 52 being greater than 1000 μm and less than or equal to 3200 μm, for example, the line width $d_{12}$ of the second line portion 52 is 1500 μm, 2000 μm, 2500 μm, 3000 μm, and so on.

In the case where the line width d2 of the constant voltage signal line 103 is 1000 μm, the line width $d_{11}$ of the first line portion 51 is 2000 μm, and the line width $d_{12}$ of the second line portion 52 is 1991.82 m, for example, the thickness of each of the constant voltage signal line 103, the first line portion 51, and the second line portion 52 is 1.8 μm, and the sheet resistance is 0.011Ω, the total resistance of the constant voltage signal line 103 in the related art calculated by the software is 0.1851 mΩ, and the width compensation of the constant voltage signal line 103 can be achieved by the first line portion 51 and the second line portion 52 in the present disclosure, and the total resistance of the constant voltage signal line 103, the first line portion 51, and the second line portion 52 is calculated to be 0.17331 mΩ. As can be seen, the resistance decrease rate on the constant voltage signal transmission path in the present disclosure is (1−0.17331/0.1851)*100=6.4%. Thus, the present disclosure can reduce the voltage drop of a constant voltage signal, improve electrical characteristics in the line, and enhance product uniformity.

In some embodiments, in the above wiring substrate provided by an embodiment of the present disclosure, as shown in FIG. 1 and FIG. 2, the orthographic projection of the first pad group 102 on the substrate 101 and the orthographic projection of the connection line 105 on the substrate 101 do not overlap with each other such that the connection line 105 avoids the first pad group 102, and shorting of the connection line 105 with the first pad group 102 is avoided.

Figure 3:
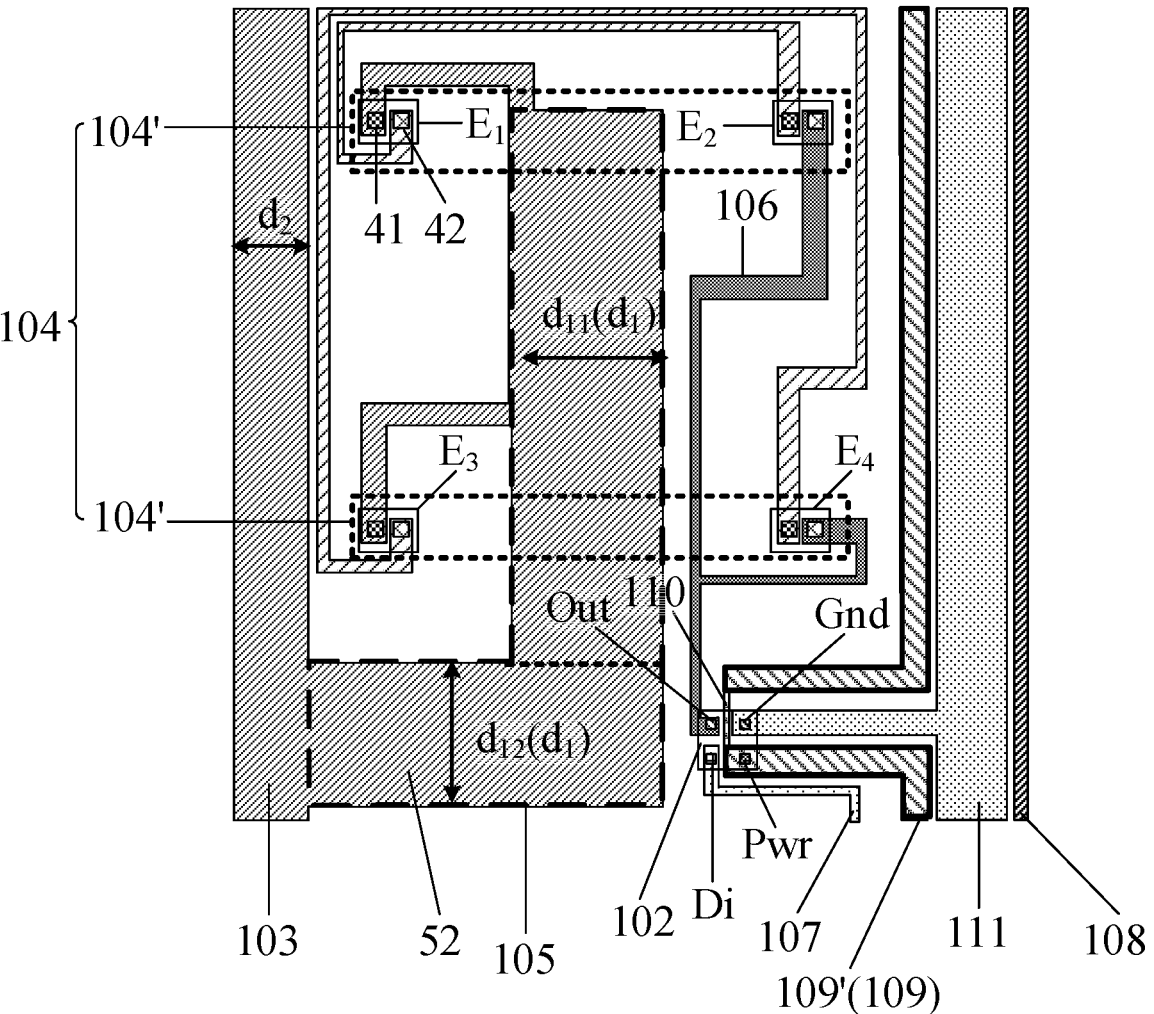
FIG. 3 is yet another structural schematic diagram of a region of a wiring substrate in which a first pad group and a coupled second pad group are located according to an embodiment of the present disclosure.
Figure 4:
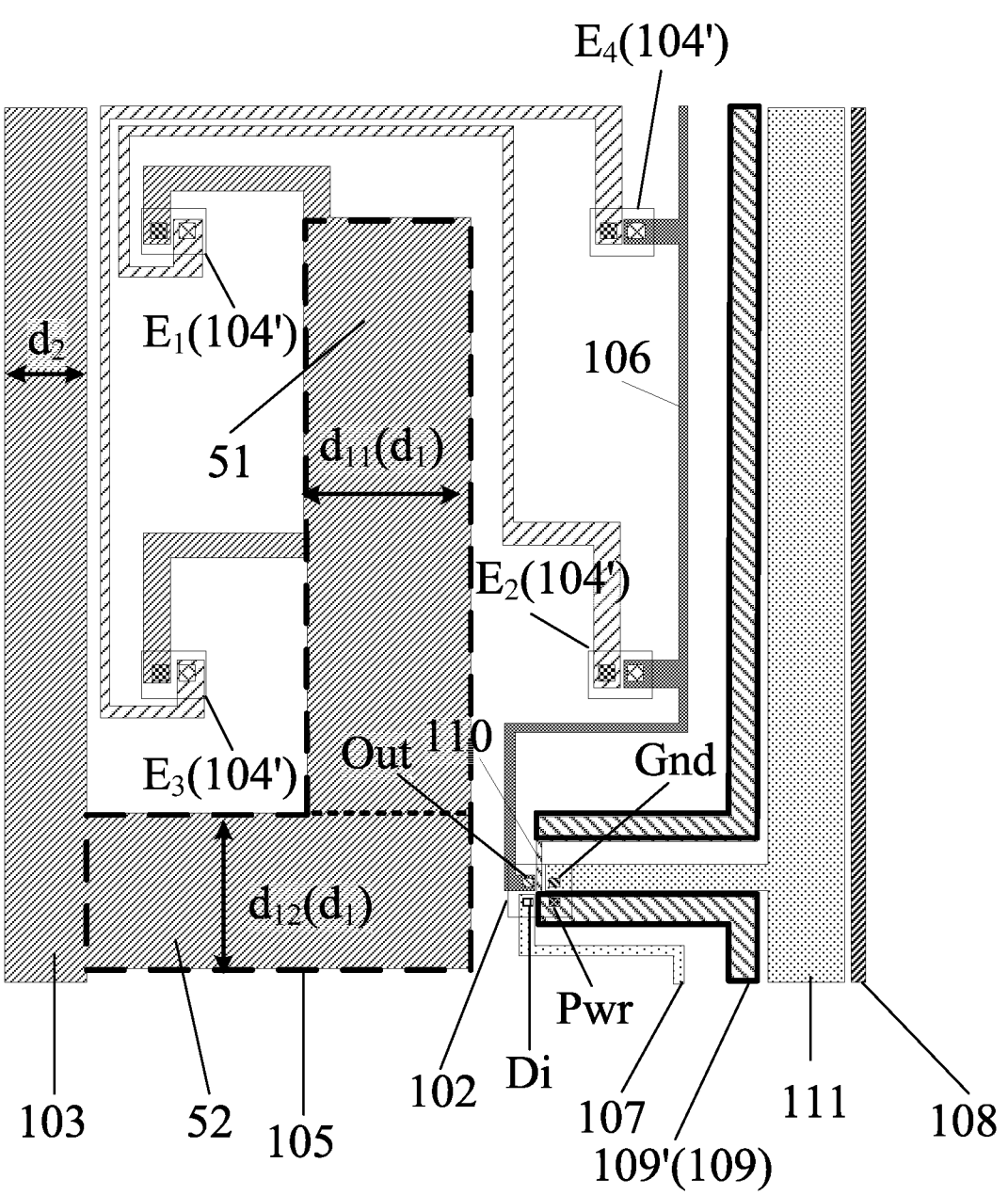
FIG. 4 is yet another structural schematic diagram of a region of a wiring substrate in which a first pad group and a coupled second pad group are located according to an embodiment of the present disclosure.

In some embodiments, in the above wiring substrate provided by an embodiment of the present disclosure, as shown in FIG. 2 to FIG. 4, the second pad group 104 may include two sub-pad groups 104' connected in parallel, wherein one sub-pad group 104' includes a first pad region $E_1$ and a second pad region $E_2$ connected in series, and the other sub-pad group 104' includes a third pad region $E_3$ and a fourth pad region $E_4$ connected in series. In some embodiments, in FIG. 2, the first pad region $E_1$ is arranged in a same column as the second pad region $E_2$; the first pad region $E_1$ is arranged in a same row as the third pad region $E_3$, and the fourth pad region $E_4$ is arranged in a same row as the second pad region $E_2$, and the fourth pad region $E_4$ is arranged in a same column as the third pad region $E_3$; in FIG. 3, the first pad region $E_1$ is arranged in a same row as the second pad region $E_2$; the first pad region $E_1$ is arranged in a same column as the third pad region $E_3$, and the fourth pad region $E_4$ is arranged in a same column as the second pad region $E_2$; and the fourth pad region $E_4$ is arranged in a same row as the third pad region $E_3$; in FIG. 4, the first pad region $E_1$ is arranged in a same column as the third pad region $E_3$; the first pad region $E_1$ is arranged in a same row as the fourth pad region $E_4$, the second pad region $E_2$ is arranged in a same row as the third pad region $E_3$; and the second pad region $E_2$ is arranged in a same column as the fourth pad region $E_4$.

It should be noted that the present disclosure is illustrated by taking the case that the second pad group 104 includes two sub-pad groups 104' and each sub-pad group 104' includes two pad regions as an example, and in some embodiments, the second pad group 104 may also include two or more sub-pad groups 104', and each sub-pad group 104' may include two or more pad regions, which is not limited herein.

In some embodiments, in the above-described wiring substrate provided by an embodiment of the present disclosure, as shown in FIG. 1 and FIG. 2, in addition to the output pad Out, the first pad group 102 also includes an address pad Di, a power pad Pwr and a ground pad Gnd, the address pad Di and the power pad Pwr belonging to the same first pad group 102 are spaced apart in the row direction X and spaced apart from the output pad Out in the column direction Y, the ground pad Gnd is spaced apart from the power pad Pwr in the column direction Y and spaced apart from the output pad Out in the row direction X. Exemplarily, the output pad Out is located in the upper left corner of the first pad group 102, the address pad Di is located in the lower left corner of the first pad group 102, the ground pad Gnd is located in the upper right corner of the first pad group 102 and the power pad Pwr is located in the lower right corner of the first pad group 102.

In some embodiments, each first pad group 102 may be coupled to one micro-driver chip 002 and each second pad group 104 may be coupled to a plurality of electronic components 003. In some embodiments, the address pad Di can receive an address signal for gating the micro-driver chip 002 for the corresponding address. The power pad Pwr can provide operating voltage and communication data for the micro-driver chip 002, the communication data can be used to control the operating state of the respective electronic component. The output pad Out may respectively output a relay signal and a drive signal in different periods of time. In some embodiments, the relay signal being an address signal provided for the address pad Di in the next level first pad group 102 and the drive signal being a drive current for driving an electronic component coupled to the first pad group 102 in which the output pad Out is located. The ground pad Gnd receives a common voltage signal.

In some embodiments, in the above-described wiring substrate provided by an embodiment of the present disclosure, as shown in FIG. 1 and FIG. 2, in the column direction Y, each first pad group 102 may be arranged in cascade. In some embodiments, the address pad Di of the first pad group 102 on the level 1 in the same column is connected to an address signal line 107, the output pad Out of the first pad group 102 on the level k (k being a positive integer) and the address pad Di of the first pad group 102 on the level (k+1) are connected by a cascade line 106, and the output pad Out of the first pad group 102 on the last level is connected to a feedback signal line 108.

In some embodiments, in the above-described wiring substrate provided by an embodiment of the present disclosure, as shown in FIG. 1 and FIG. 2, the wiring substrate further includes a power signal line 109 with a plurality of sub-segments 109', one sub-segment 109' is connected to the power pad of one first pad group 102 in a column. In some embodiments, two sub-segments 109' adjacent in the column direction Y may be connected to each other by one connection lead 110 to enable the same power signal line 109 to power the power pads Pwr of the plurality of first pad group 102 cascaded in the column. In some embodiments, the connection lead 110 is of unitary construction with the sub-segments 109'.

In some embodiments, in the above-described wiring substrate provided by embodiments of the present disclosure, as shown in FIG. 1 and FIG. 2, a common voltage signal line 111 may be further included, and the ground pads Gnd of all the first pad group 102 provided in cascade in one column may be connected to the same common voltage signal line 111.

In some embodiments, in the above-described wiring substrate provided by an embodiment of the present disclosure, the constant voltage signal line 103, the cascode line 106, the address signal line 107, the feedback signal line 108, the power supply signal line 109, the connection lead 110, and the common voltage signal line 111 can be arranged in the same layer in order to reduce process steps and save manufacturing costs. In the present disclosure, the "same-layer" refers to a layer structure formed by a one-time patterning process using the same mask, and in the layer structure, a film layer for making a particular pattern is formed using the same film formation process. That is, one patterning process corresponds to one mask. Depending on the particular pattern, the one-time patterning process may include multiple exposures, development or etching processes, while the particular pattern formed in the layer structure may be continuous or discontinuous, may be at the same height or have the same thickness, or may be at different heights or have different thicknesses.

In some embodiments, the above wiring substrate provided by an embodiment of the present disclosure further includes an insulating layer having a plurality of hollow structures arranged on a side of all of the line layers furthest from the substrate, each hollow structure exposing an end of a portion of the lines to form respective pad regions (e.g., $E_1$ to $E_4$ in FIG. 1) and a first pad group 102, respectively. In some embodiments, the insulating layer may be made of a material with high reflectivity, such as white ink or the like.

Figure 5:
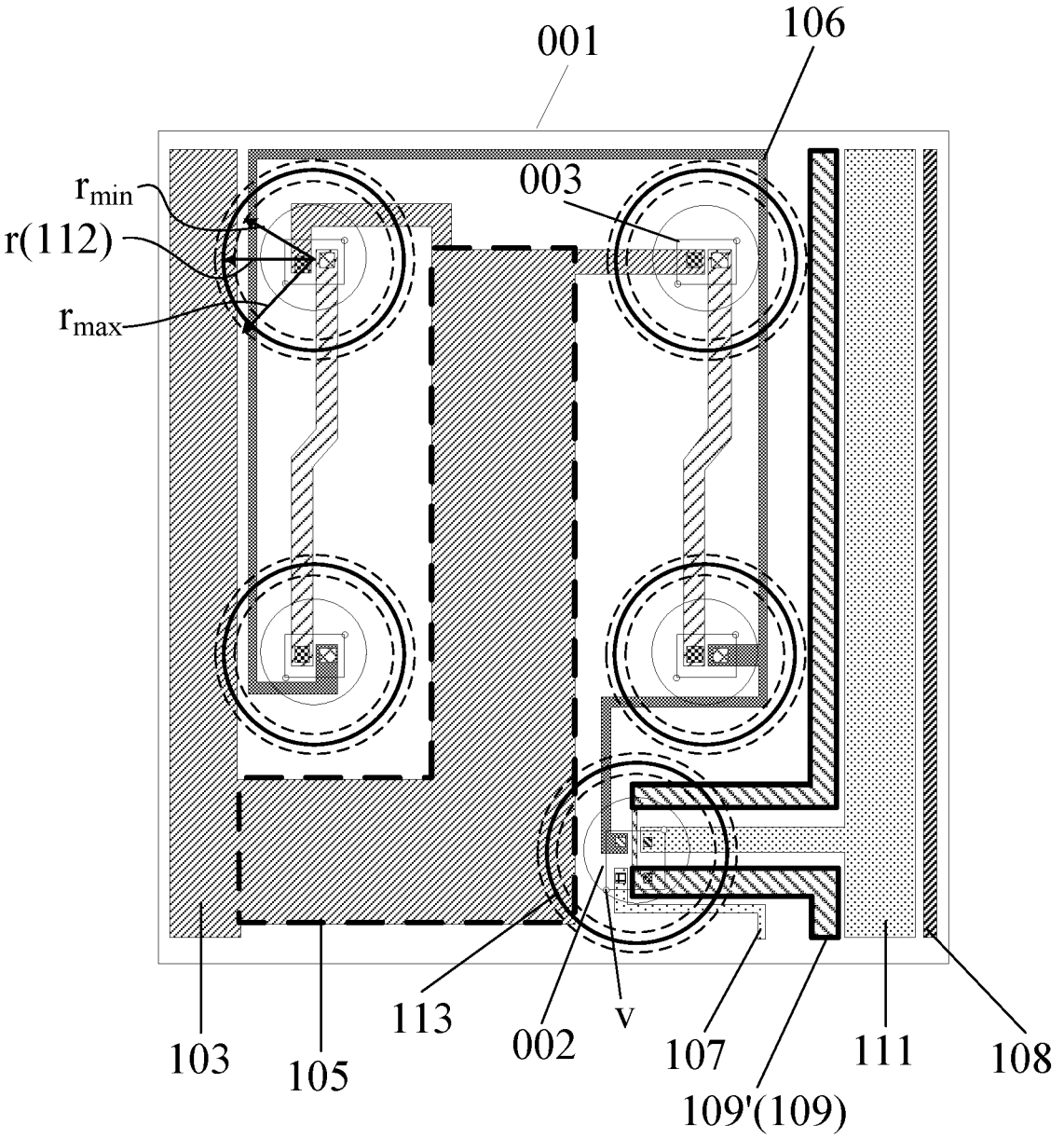
FIG. 5 is a structural schematic diagram of a region of an electronic device in which a first pad group and a coupled second pad group are located according to an embodiment of the present disclosure.

Based on the same inventive concept, embodiments of the present disclosure provide an electronic device, as shown in FIG. 5, that includes the above-described wiring substrate 001, a micro-driver chip 002 coupled to a first pad group 102, and electronic components 003 coupled to a second pad group 104 according to an embodiment of the present disclosure. The specific implementation of the electronic device provided by the embodiment of the present disclosure can be referred to the specific implementation of the above-described wiring substrate provided by the embodiment of the present disclosure, and repeated descriptions thereof are not repeated. In some embodiments, an orthographic projected area of the micro-driver chip 002 on the substrate 101 is no more than 300000 $\mu m^2$; the electronic component 003 is a light emitting component having a light emitting area of not more than 300000 $\mu m^2$, in particular, not more than 40000 $\mu m^2$, the light emitting component having two pins, each pad area (e.g. $E_1$ to $E_4$) including a first pad 41 and a second pad 42, respectively connected in correspondence with the two pins of the light emitting component. It will be appreciated that when the electronic component 003 is another component, it may have other numbers of pins, and accordingly, each pad region (e.g. $E_1$ to $E_4$) has the same number of pads as the pins of the component.

Figure 6:
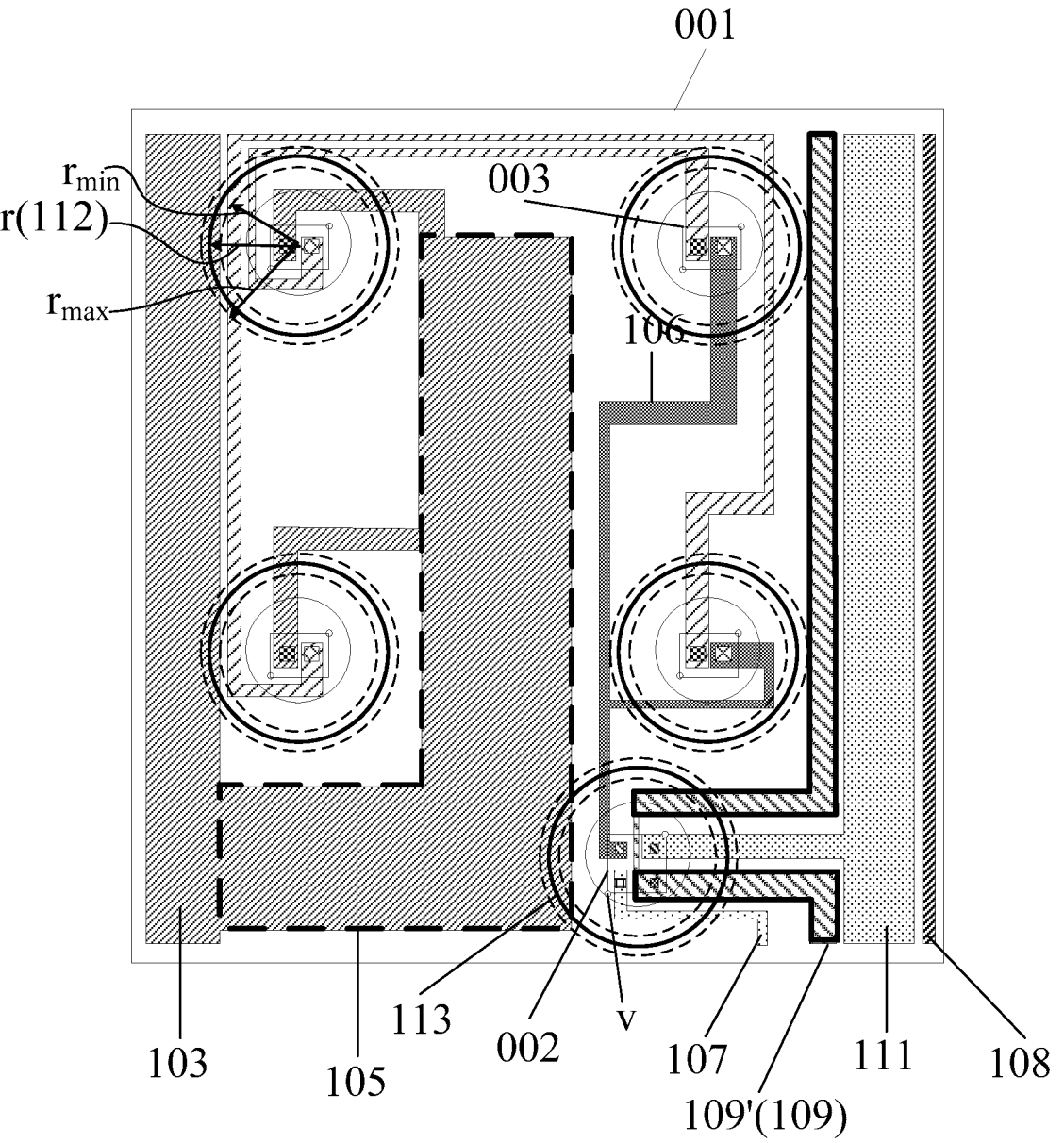
FIG. 6 is yet another structural schematic diagram of a region of an electronic device in which a first pad group and a coupled second pad group are located according to an embodiment of the present disclosure.
Figure 7:
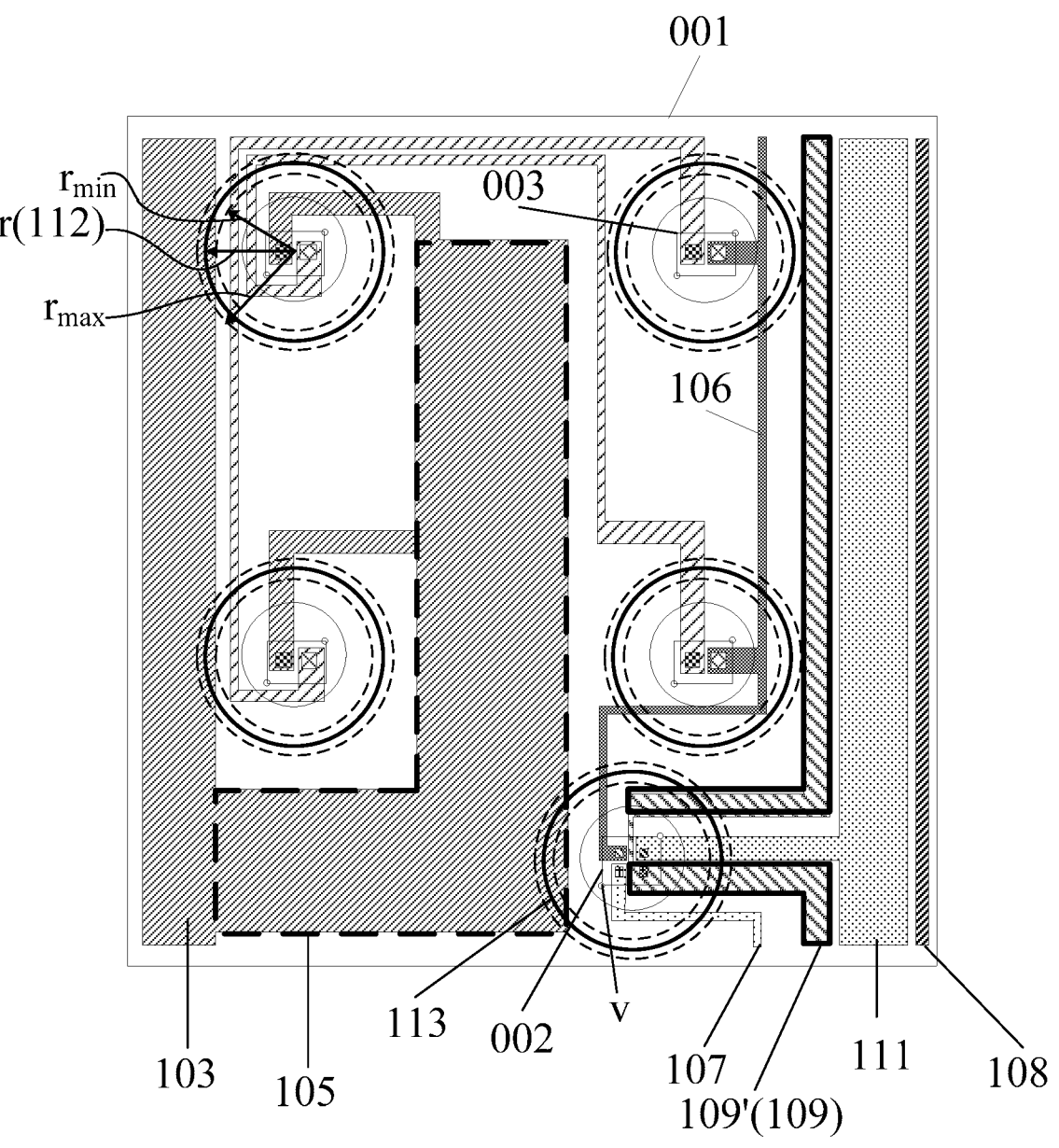
FIG. 7 is yet another structural schematic diagram of a region of an electronic device in which a first pad group and a coupled second pad group are located according to an embodiment of the present disclosure.
Figure 8:
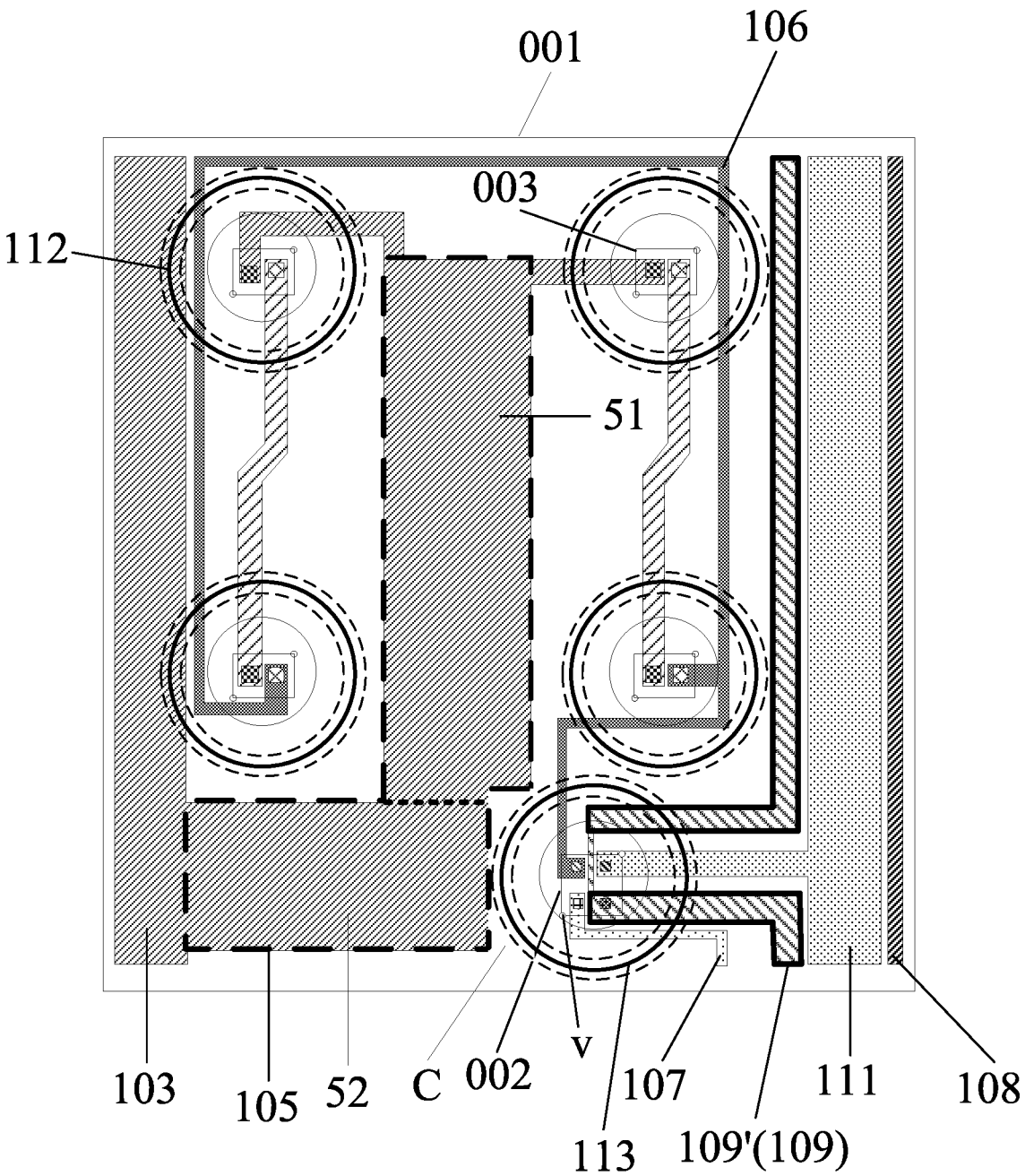
FIG. 8 is yet another structural schematic diagram of a region of an electronic device in which a first pad group and a coupled second pad group are located according to an embodiment of the present disclosure.

In some embodiments, the above-described electronic device provided by an embodiment of the present disclosure, as shown in FIG. 5 to FIG. 7, the electronic device may further include a plurality of first transparent protection structures 112, an orthographic projection of each first transparent protection structure 112 on the substrate 101 covers an orthographic projection of each electronic component 003 on the substrate 101, respectively, to protect each electronic component 003 by the first transparent protection structure 112, and the first transparent protection structure 112 can also function to boost light efficiency in case that the electronic component 003 is a light emitting component.

In some embodiments, the first transparent protection structure 112 may be fabricated by way of dispensing or steel mesh printing. In some embodiments, in order to achieve better protection and effectively improve light efficiency, the first transparent protection structure 112 may form a dome shape over the electronic component 003 (e.g., the light emitting component), the first transparent protection structure 112 of this shape may be referred to as a droplet lens, and the radius r of the orthographic projection of the first transparent protection structure 112 on the substrate 101 may be 1450 $\mu m$. However, given that deviations will occur when the first transparent protection structure 112 is actually fabricated, the deviation can be within ±150 $\mu m$, for example, that is, a maximum radius $r_{max}$ of the orthographic projection of the first transparent protection structure 112 on the substrate 101 is 1600 $\mu m$ and a minimum radius $r_{min}$ is 1400 $\mu m$.

In some embodiments, in the above-described electronic device provided by an embodiment of the present disclosure, as shown in FIG. 5 to FIG. 7, the space between the pad regions E within the second pad group 104 is sufficiently large that the line width of the connection line 105 can be effectively guaranteed to meet a voltage drop requirement, thus, the orthographic projection of the connection line 105 on the substrate 101 may not overlap with the orthographic projection of the first transparent protection structure 112 on the substrate 110 to avoid the connection line 105 from being adhered by the first transparent protection structure 112, and the phenomenon that the first transparent protection structure 112 is scratched in the process of production and transportation and accidentally drives the connection line 105 to cause the connection line 105 to fall off is avoided. In some embodiments, a distance between the orthographic projection of the connection line 105 on the substrate 101 and a maximum orthographic projection of the first transparent protection structure 112 on the substrate 101 (e.g. the radius of the orthographic projection is 1600 $\mu m$) is greater than or equal to 50 $\mu m$.

In some embodiments, in the above electronic device provided by an embodiment of the present disclosure, as shown in FIG. 5 to FIG. 7, the electronic device further includes a second transparent protection structure 113, the orthographic projection of the second transparent protection structure 113 on the substrate 101 covers the orthographic projection of the micro-driver chip 002 on the substrate 101 to protect the micro-driver chip 002 through the second transparent protection structure 113. For ease of fabrication, the fabrication requirements of the second transparent protection structure 113 and the first transparent protection structure 112 may be the same, and both are formed in the same process flow.

In some embodiments, in the above-described electronic device provided by an embodiment of the present disclosure, as shown in FIG. 5 to FIG. 8, the orthographic projection of the connection line 105 on the substrate 101 overlaps at most partially with the orthographic projection of the second transparent protection structure 113 on the substrate 101 to reduce the risk that the connection line 105 is adhered by the second transparent protection structure 113, and the second transparent protection structure 113 is scratched in the process of production and transportation and accidentally drives the connection line 105 to cause the connection line 105 to fall off. In some embodiments, a distance between the orthographic projection of the connection line 105 on the substrate 101 and a minimum orthographic projection of the second transparent protection structure 113 on the substrate 101 (e.g. the radius of the orthographic projection is 1400 $\mu m$) is less than or equal to 50 $\mu m$, and a distance between the orthographic projection of the connection line 105 on the substrate 101 and a wafer bonding marker v of the micro-driver chip 002 is greater than or equal to 40 $\mu m$.

In some embodiments, in the above-described electronic device provided by an embodiment of the present disclosure, if the space between adjacent second pad groups 104 is large enough, the line width of the connection line 105 can be effectively guaranteed to meet a voltage drop requirement, the connection line 105 may be provided with a concave part C in the intersection area of the first line portion 51 and the second line portion 52, the orthographic projection of the first line portion 51 on the substrate 101 do not overlap with the orthographic projection of the second transparent protection structure 113 on the substrate 101; and the orthographic projection of the second line portion 52 on the substrate 101 do not overlap with the orthographic projection of the second transparent protection structure 113 on the substrate 101, such that the connection line 105 avoids the second transparent structure 113 at the concave part C.

Figure 9:
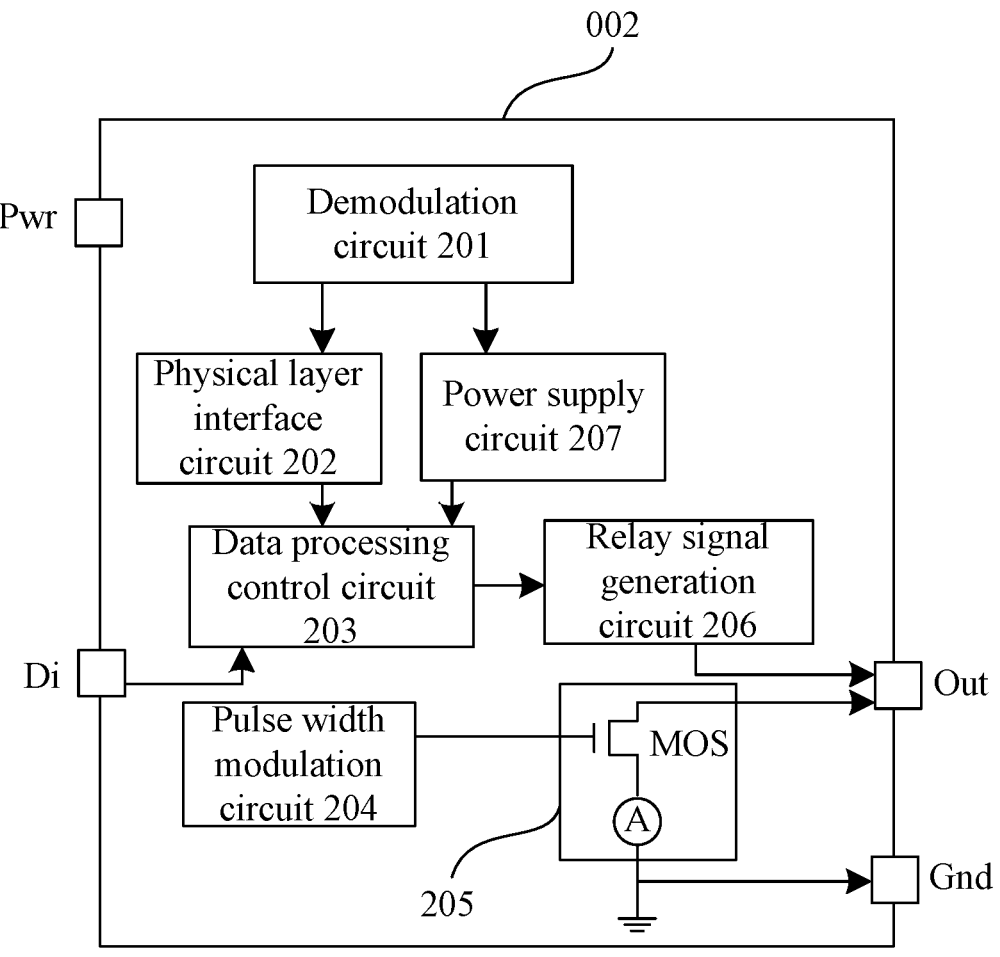
FIG. 9 is a structural schematic diagram of a micro-driver chip according to an embodiment of the present disclosure.

In some examples, as shown in FIG. 9, the micro-driver chip 002 can include a demodulation circuit 201, a physical layer interface circuit 202, a data processing control circuit 203, a pulse width modulation circuit 204, a drive signal generation circuit 205, a relay signal generation circuit 206, and a power supply circuit 207.

In some embodiments, the demodulation circuit 201 is electrically connected to the power pad Pwr and the physical layer interface circuit 202 and is configured to demodulate a power line carrier communication signal input by the power pad Pwr to obtain communication data and transmit the communication data to the physical layer interface circuit. In the case where the electronic component 003 is a light-emitting component, the communication data may be data reflecting the light emission duration, thus representing the required luminous brightness. The embodiments of the present disclosure may effectively reduce the number of signal lines by using a Power Line Carrier Communication (PLC) protocol to superimpose the communication data on the power signal instead of the usual Serial Peripheral Interface (SPI) protocol.

In some embodiments, the physical layer interface circuit 202 is also electrically connected to the data processing control circuit 203, and is configured to process the communication data to obtain data frames (e.g., frame rate data), and transmit the data frames to the data processing control circuit 203. The data frames from the physical layer interface circuit 202 contain information that needs to be transmitted to the micro-drive chip 002, such as information related to the emission time (e.g., the specific duration of the emission time). In some embodiments, the physical layer interface circuit 202 is a typical port Physical (PHY) layer, for detailed description, please refer to conventional design, which will not be detailed here.

In some embodiments, the data processing control circuit 203 is also electrically connected to an address pad Di, a pulse width modulation circuit 204, and a relay signal generation circuit 206. The data processing control circuit 203 is configured to generate a pulse width control signal based on the data frames and transmit the pulse width control signal to the pulse width modulation circuit 204, thus generating a relay control signal based on the address signal and transmitting the relay control signal to the relay signal generation circuit 206. For example, the duration of light emission required by the light emitting component connected to the micro-driver chip 002 can be known from the data frames, and thus the corresponding pulse width control signal is generated based on the duration of light emission. For example, the relay control signal is a signal generated after the data processing control circuit 203 processes the first input signal. By processing (e.g., resolving, latching, decoding, etc.) the address signal, the address signal corresponding to the micro-driver chip 002 can be acquired and a relayed control signal corresponding to a subsequent address can be generated, and the subsequent address corresponds to other micro-driver chips 002. In some embodiments, the data processing control circuit 203 may be implemented as a single-chip machine, a Central Processing Unit (CPU), a digital signal processor, or the like.

In some embodiments, the pulse width modulation circuit 204 is also electrically connected with drive signal generation circuit 205, configured to generate a pulse width modulation signal in response to the pulse width control signal, and transmit the pulse width modulation signal to the drive signal generation circuit 205. For example, the pulse width modulation signal generated by the pulse width modulation circuit 204 determines the duration of light emission by the light emitting component, e.g., the effective pulse width duration is equal to the duration of light emission by the light emitting component.

In some embodiments, the drive signal generation circuit 205 is also electrically connected to the output pad Out, configured to generate a drive signal in response to the pulse width modulation signal, and output the drive signal from the output pad Out. Here, outputting the drive signal from the output pad Out may mean that the drive signal (e.g., drive current) flows from the output pad Out to the light emitting component or may mean that the drive signal (e.g., drive current) flows from the light emitting component to the output pad Out, and the specific current direction is not limited.

In some embodiments, when the drive signal is a drive current, the drive signal generation circuit 205 may include a current source A and a transistor MOS whose control pole receives the pulse width modulation signal transmitted by the pulse width modulation circuit 204 to be turned on or off under the control of the pulse width modulation signal. A first pole of the transistor MOS is connected with the output pad Out, a second pole of the transistor MOS is connected with a first pole of the current source A, and a second pole of the current source A is connected with the ground pad Gnd to receive a common voltage. In some embodiments, the current source A may be a constant current source. When the pulse width modulation signal is an active level, the transistor MOS is turned on and the current source A provides a drive current through the output pad Out. When the pulse width modulation signal is an inactive level, the transistor MOS is turned off, at which time no drive current is provided by the output pad Out. The duration of the active level of the pulse width modulation signal is equal to the ON duration of the transistor MOS, the ON duration of the transistor MOS is equal to the duration that the output pad Out provides the drive current. Thus, the duration of light emission of the light-emitting component can be further controlled and thus the visual luminance can be controlled. In some embodiments, when the transistor MOS is turned on, the drive current flows from output pad Out into micro-driver chip 002, and sequentially flows through the transistor MOS and the current source A, and then flows into a grounded terminal (e.g., ground pad Gnd). It should be noted that the drive signal generation circuit 205 may also take other circuit structure forms in the embodiments of the present disclosure, and the embodiments of the present disclosure are not limited thereto.

In some embodiments, the relay signal generation circuit 206 is also electrically connected to the output pad Out, configured to generate a relay signal based on the relay control signal, and output the relay signal from the output pad Out. For example, the relay control signal corresponds to a subsequent address and a relay signal generated based on the relay control signal contains the subsequent address corresponding to other micro-driver chips 002. The relay signal is output from the output pad Out and provided to the address pad Di of the micro-driver chip 002 cascaded on the next level, thereby causing the micro-driver chip 002 cascaded on the next level to acquire the corresponding address signal. The relay signal generation circuit 206 may be implemented by a latch, a decoder, an encoder, etc., and the embodiments of the present disclosure are not limited thereto.

It should be noted that, in an embodiment of the present disclosure, although both the drive signal generation circuit 205 and the relay signal generation circuit 206 are electrically connected to the output pad Out, the drive signal generation circuit 205 and the relay signal generation circuit 206 output the drive signal and the relay signal at different periods, respectively, the drive signal and the relay signal are transmitted in a time-sharing manner through the output pad Out and therefore do not affect each other.

In some embodiments, the power supply circuit 207 is electrically connected to the demodulation circuit 201 and the data processing control circuit 203, respectively, and is configured to receive electrical energy and power the data processing control circuit 203. In some embodiments, after the demodulation circuit 201 demodulates the power line carrier communication signal input from the power pad Pwr, the DC power supply component (i.e., electrical energy) of the power line carrier communication signal is transmitted to the power supply circuit 207, and then is provided to the data processing control circuit 203 via the power supply circuit 207. Of course, the embodiments of the present disclosure are not limited thereto and the power supply circuit 207 may also be electrically connected to other circuits in the micro-driver chip 002 to provide electrical energy. The power supply circuit 207 may be implemented by a switching circuit, a voltage conversion circuit, a voltage stabilizing circuit, and the like, and the embodiments of the present disclosure are not limited thereto.

It should be noted that the micro-driver chip 002 provided by the present disclosure may also include more circuits and components, not limited to the demodulation circuit 201, the physical layer interface circuit 202, the data processing control circuit 203, the pulse width modulation circuit 204, the drive signal generation circuit 205, the relay signal generation circuit 206, and the power supply circuit 207 described above, the circuits and components may be determined by the functions to be implemented, and the embodiments of the present disclosure are not limited thereto.

It will be apparent to those skilled in the art that various modifications and variations can be made to the embodiments of the disclosure without departing from the spirit and scope of the embodiments of the disclosure. Thus, if these modifications and variations of the embodiments of the disclosure fall within the scope of the claims of the disclosure and its equivalent technology, the disclosure is also intended to include these modifications and variations.

What is claimed is:

1. A wiring substrate, comprising:
a substrate;
a first pad group, arranged on the substrate, wherein the first pad group comprises an output pad;
a constant voltage signal line, arranged on a same side of the substrate as the first pad group; and
a second pad group, comprising a plurality of sub-pad groups connected in parallel, wherein each of the sub-pad groups comprises a plurality of pad regions connected in series.

2. The wiring substrate of claim 1, further comprising a connection line, wherein the constant voltage signal line is coupled to the plurality of sub-pad groups connected in parallel through the connection line.

3. The wiring substrate of claim 2, wherein the wiring substrate comprises a plurality of second pad groups;
the plurality of second pad groups are arranged in an array on the substrate;
all of the pad regions in a same second pad group are arranged in an array on the substrate; and
at least a portion of the connection line is located between at least two of the pad regions in the second pad group.

4. The wiring substrate of claim 3, wherein a line width of the connection line is greater than a line width of the constant voltage signal line.

5. The wiring substrate of claim 2, wherein the connection line comprises:
a first line portion with a same extension direction as the constant voltage signal line; and
a second line portion with an extension direction crossed with the constant voltage signal line;
wherein the second line portion connects the constant voltage signal line with the first line portion.

6. The wiring substrate of claim 2, wherein an orthographic projection of the first pad group on the substrate and an orthographic projection of the connection line on the substrate do not overlap each other.

7. The wiring substrate of claim 1, wherein the second pad group comprises two sub-pad groups connected in parallel;
one sub-pad group comprises a first pad region and a second pad region connected in series; and the other sub-pad group comprises a third pad region and a fourth pad region connected in series.

8. The wiring substrate of claim 7, wherein the first pad region is arranged in a same column as the second pad region;
the first pad region is arranged in a same row as the third pad region;
the fourth pad region is arranged in a same row as the second pad region; and
the fourth pad region is arranged in a same column as the third pad region.

9. The wiring substrate of claim 7, wherein the first pad region is arranged in a same row as the second pad region;
the first pad region is arranged in a same column as the third pad region;
the fourth pad region is arranged in a same column as the second pad region; and
the fourth pad region is arranged in a same row as the third pad region.

10. The wiring substrate of claim 7, wherein the first pad region is arranged in a same column as the third pad region;
the first pad region is arranged in a same row as the fourth pad region;
the second pad region is arranged in a same row as the third pad region; and
the second pad region is arranged in a same column as the fourth pad region.

11. An electronic device, comprising:
the wiring substrate of claim 1;
a driver chip coupled to the first pad group; and
electronic components coupled to the second pad group.

12. The electronic device of claim 11, further comprising a plurality of first transparent protection structures;
wherein an orthographic projection of each of the first transparent protection structures on the substrate covers an orthographic projection of each of the electronic components on the substrate.

13. The electronic device of claim 12, wherein an orthographic projection of the connection line on the substrate and an orthographic projection of each of the first transparent protection structures on the substrate do not overlap each other.

14. The electronic device of claim 11, further comprising second transparent protection structures;
wherein an orthographic projection of each of the second transparent protection structures on the substrate covers an orthographic projection of the driver chip on the substrate.

15. The electronic device of claim 14, wherein an orthographic projection of the connection line on the substrate at most partially overlaps with an orthographic projection of the second transparent protection structures on the substrate.

16. The electronic device of claim 15, wherein the connection line is provided with a concave part in an intersection area of the first line portion and the second line portion;
an orthographic projection of the first line portion on the substrate do not overlap with an orthographic projection of the second transparent protection structures on the substrate; and
an orthographic projection of the second line portion on the substrate do not overlap with an orthographic projection of the second transparent protection structures on the substrate.

17. The electronic device of claim 11, further comprising a connection line, wherein the constant voltage signal line is coupled to the plurality of sub-pad groups connected in parallel through the connection line.

18. The electronic device of claim 17, wherein the wiring substrate comprises a plurality of second pad groups;

the plurality of second pad groups are arranged in an array on the substrate;

all of the pad regions in a same second pad group are arranged in an array on the substrate; and at least a portion of the connection line is located between at least two of the pad regions in the second pad group.

19. The electronic device of claim 18, wherein a line width of the connection line is greater than a line width of the constant voltage signal line.

20. The electronic device of claim 17, wherein the connection line comprises:

a first line portion with a same extension direction as the constant voltage signal line; and a second line portion with an extension direction crossed with the constant voltage signal line;

wherein the second line portion connects the constant voltage signal line with the first line portion.

\* \* \* \* \*